US008557390B2

(12) United States Patent
Drescher et al.

(10) Patent No.: US 8,557,390 B2
(45) Date of Patent: Oct. 15, 2013

(54) GLASS PRODUCT

(75) Inventors: Thomas Drescher, Gifhorn (DE); Bernd Hangleiter, Gifhorn (DE); Joachim Schuetz, Hillerse (DE); Annegret Matthai, Baar-Ebenhausen (DE); Heike Walter, Braunschweig (DE); Felix Horstmann, Braunschweig (DE); Bernd Szyszka, Braunschweig (DE); Volker Sittinger, Braunschweig (DE); Wolfgang Werner, Braunschweig (DE); Tjhay Weyna Boentoro, Braunschweig (DE)

(73) Assignee: Audi AG, Ingolstadt (DE)

( * ) Notice: Subject to any disclaimer, the term of this patent is extended or adjusted under 35 U.S.C. 154(b) by 337 days.

(21) Appl. No.: 12/997,231

(22) PCT Filed: Jun. 9, 2009

(86) PCT No.: PCT/EP2009/004116
§ 371 (c)(1),
(2), (4) Date: May 12, 2011

(87) PCT Pub. No.: WO2009/149889
PCT Pub. Date: Dec. 17, 2009

(65) Prior Publication Data
US 2011/0223415 A1    Sep. 15, 2011

(30) Foreign Application Priority Data

Jun. 13, 2008    (DE) .......................... 10 2008 028 141

(51) Int. Cl.
    *B32B 17/06*    (2006.01)
(52) U.S. Cl.
    USPC ........... 428/432; 428/688; 428/689; 428/699; 428/701; 428/702; 428/704; 204/192.1; 204/192.12; 204/192.15; 204/192.29
(58) Field of Classification Search
    USPC ......... 428/432, 688, 689, 699, 701, 702, 704; 204/192.1, 192.12, 192.15, 192.29
    See application file for complete search history.

(56) References Cited

U.S. PATENT DOCUMENTS

| 6,495,251 B1 | 12/2002 | Arbab et al. |
| 2007/0029186 A1 | 2/2007 | Krasnov et al. |

(Continued)

FOREIGN PATENT DOCUMENTS

| DE | 69210860 T2 | 11/1996 |
| EP | 0500445 B | 5/1996 |

(Continued)

OTHER PUBLICATIONS

PCT International Search Report completed by the ISA/EP in connection with PCT/EP2009/004116 on Sep. 16, 2009.

(Continued)

*Primary Examiner* — David Sample
*Assistant Examiner* — Lauren Colgan
(74) *Attorney, Agent, or Firm* — Barnes & Thornburg LLP

(57) ABSTRACT

The present invention relates to a glass product, comprising a glass substrate with a transparent and conductive indium tin oxide layer having a covering layer, which forms a redox barrier for the indium tin oxide layer, wherein the indium tin oxide layer is obtained by pulsed, highly ionizing high-power magnetron sputtering (HPPMS) in which—the pulses of the magnetron have a peak power density greater than 1.5 kW/cm$^2$,—the pulses of the magnetron have a time duration that is ≤200 μs, and—the mean current flow density rise upon ignition of the plasma within a time interval that is ≤0.025 ms is at least 106 A(ms cm2), and the indium tin oxide layer has a crystalline structure, in such a way that the (222)-reflection of an X-ray diffraction spectrum after the production of the indium tin oxide layer is shifted relative to the powder spectrum of indium tin oxide by a maximum of 1 degree, preferably by 0.3 degrees to 0.5 degrees, in the direction of compressive stress and is shifted after heat treatment by a maximum of 1 degree, preferably by 0.2 degrees to 0.4 degrees, in the direction of the powder spectrum.

17 Claims, 5 Drawing Sheets

(56) References Cited

U.S. PATENT DOCUMENTS

2010/0006426 A1* 1/2010 Sittinger et al. ......... 204/192.29
2010/0006837 A1* 1/2010 Cho et al. ........................ 257/43

FOREIGN PATENT DOCUMENTS

WO       03093185 A    11/2003
WO    2007018951 A1     2/2007
WO    WO2008040502  *  4/2008

OTHER PUBLICATIONS

Written Opinion (in German) issued in connection with PCT/EP2009/004116.

Sittinger, et al. "High Power Pulsed Magnetron Sputtering of Transparent Conducting Oxides", Oct. 16, 2007, vol. 516, No. 17.

Search Report for German priority application No. 102008028141.7.

* cited by examiner

GLASS PRODUCT

CROSS REFERENCE TO RELATED APPLICATIONS

This application is a U.S. national counterpart application of international application serial No. PCT/EP2009/004116 filed Jun. 9, 2009, which claims priority to German Patent Application No. 102008028141.7 filed Jun. 13, 2008. The entire disclosures of PCT/EP2009/004116 and DE 102008028141.7 are hereby incorporated by reference.

The present invention relates to a glass product, comprising a glass substrate with a transparent and conductive indium tin oxide layer having a covering layer, which forms a redox barrier for the indium tin oxide layer.

Icing of exterior glazing and exterior mirrors of motor vehicles as a result of condensation of water vapor and subsequent ice formation is a problem that has been known for decades in motor vehicle technology. As a result of the ever smaller $U_g$ values of the glazing in the field of architecture, this problem is likewise occurring to an increasing extent in that field. Alongside losses of convenience, technical disadvantages in respect of safety furthermore also arise in the vehicle glass sector.

Whilst dispensing with manual wiping or scraping ice, it is possible to obtain a mist-free or ice-free glass surface in several different ways, in principle. In this context, the concepts mentioned below, in particular, are relevant in practice.

(i.) the beading away of condensed moisture before ice formation has actually taken place, by virtue of a superhydrophobic embodiment of the glazing, (ii.) the rapid defrosting of the glazing by means of a substantially whole-area electrical pane heating, (iii.) the suppression of the condensation of moisture on the exterior surface of the glazing by means of an exterior coating having a low thermal emissivity.

A superhydrophobic coating of the glazing can prevent ice formation, in principle, since the moisture that has condensed on oblique areas forms droplets which bead away given sufficient hydrophobicity (order of magnitude: water contact angle >160°) and sufficient downhill-slope force. One disadvantage of superhydrophobic exterior coatings of a glass product is that they have an inadequate mechanical and chemical durability, the latter hitherto having prevented technical implementation in motor vehicle construction.

A whole-area electrical heating of an exterior glazing of a vehicle likewise enables defrosting in accordance with the long known concept of the electrically heatable rear window. For whole-area electrically heatable vehicle glazings the prior art already provides corresponding solutions for laminated glazings using wire fabrics incorporated by lamination or using the existing Ag-based sun protection coatings of the exterior glazings. In this case, the cost problem, in particular, is regarded as critical since, in addition to the restriction to laminated glazings, it is primarily also necessary to provide a powerful electric current supply in the motor vehicle in order to operate the whole-area pane heating.

An exterior coating having a low thermal emissivity is suitable, in principle, for effectively preventing ice formation on the surface of a glass product in typical misting and icing situations. In this case, the starting point is the reduction of the thermal emissivity from $\epsilon=0.85$ for the uncoated glass substrate to $\epsilon<0.3$ after the application of the coating having a low thermal emissivity. This measure reduces the cooling of the surface of the glass product through exchange of radiation with the sky, with the result that the dew point is undershot with a temporal delay in the region of the surface by comparison with the surroundings. Overall, this has the effect that the moisture present in the atmosphere no longer condenses on the glass, but rather in other regions (for example in the surroundings or on lacquered areas of the motor vehicle).

The concept of an exterior coating having a low thermal emissivity for preventing ice formation on an exterior surface of a glass product has already been investigated at various points in the past. Thus, this concept has been relevant for years in the field of architectural glass coating, for example, since highly thermally insulating windows, in contrast to more poorly insulating windows, tend toward dew formation. In this context, optical functional layers based on $SnO_2$ have often been used, which have already proved to be worthwhile in industrial application on account of their advantageous chemical and mechanical properties. Since the 1940s, for example, spray-pyrolytically produced coatings based on $SnO_2$:F have been used as heating panes of low emissivity in aircraft construction. Transparent and conductive $SnO_2$:F layers are likewise used as interior coating of low emissivity in the field of architectural glass coatings (cf. Gläser J. H.: Dünnfilmtechnologie auf Flachglass [Thin-film technology on flat glass], chapter 5.1.3.2, Verlag Karl Hofmann, ISBN 3-7780-1041-7, Schondorf (1999)) in order thereby to suppress the condensation of moisture on the interior side of the glazing. Dew formation on a glazing can therefore be suppressed in a targeted manner by means of an exterior coating having a low thermal emissivity on the basis of pyrolytically produced $SnO_2$:F functional layers. It has been found, however, that glass products having a relatively rough, pyrolytically produced $SnO_2$:F coating are unsuitable for use in vehicle construction since they have an inadequate mechanical stability and inadequate optical properties.

Layers of low emissivity on exterior glazings of a motor vehicle can therefore in principle prevent the dew and/or frost covering. However, the glass product coatings of low emissivity that are produced by the methods known from the prior art are afflicted with an inadequate stability of the layer system, which exhibits increased haze as early as during production or else leads to increased haze as a result of a stress. One reason for the inadequate stability is, inter alia, the comparatively rough surface in glass products having an exterior coating based on fluorine-doped $SnO_2$ and the associated haze. Hitherto, on the basis of other conductive metal oxides, it has likewise not been possible to produce a product having sufficiently high mechanical and chemical stability in conjunction with high optical transmission and likewise high electrical conductivity.

One example of transparent conductive coatings (for short: TCO coatings; TCO=Transparent Conductive Oxide) of a substrate is an indium tin oxide layer (ITO layer), which, in the case of the methods known from the prior art, however, has to be produced at substrate temperatures of approximately 300° C. in order to obtain a sufficiently good mechanical and chemical stability and also good electrical and optical functional properties.

By contrast, if ITO layers are produced at room temperature and completely crystallized in a subsequent heat treatment process, the degradation of the TCO layers has to be prevented by means of a suitable covering layer, as is described in EP 0 500 445 B1, for example. The aforementioned document describes a method for producing a conductive metal oxide layer on a glass substrate, wherein the metal oxide layer is subjected to a thermal treatment of the type bending/prestressing/hardening. In order to protect the metal oxide layer against oxidation, a covering layer is applied to the metal oxide layer. Said covering layer can consist, for example, of aluminum oxide, titanium dioxide, zinc oxide, zirconium oxide, chromium oxide or silicon dioxide. WO 03/093185 A1 furthermore discloses barrier layers for TCO-based layer systems composed of metal oxide, metal nitride and metal oxynitride.

The glass products having a transparent and conductive coating of low emissivity which are known from the prior art have the disadvantage that they do not meet the mechanical and optical requirements made of exterior glazings of motor vehicles.

This is the starting point for the present invention.

The present invention is based on the object of providing a glass product of the type mentioned in the introduction comprising a transparent and conductive indium tin oxide layer of low emissivity, which glass product has a high mechanical and chemical stability and also a high optical transmission and is suitable, in particular, for the production of exterior glazings or exterior mirrors of motor vehicles.

This object is achieved by means of a glass product of the type mentioned in the introduction comprising the features of the characterizing part of claim 1. The dependent claims relate to advantageous developments of the invention.

According to the invention it is provided that the indium tin oxide layer on a surface of the glass substrate is obtained by pulsed, highly ionizing high-power magnetron sputtering (for short: HPPMS) in which
the pulses of the magnetron have a peak power density that is greater than $1.5 \text{ kW/cm}^2$,
the pulses of the magnetron have a time duration that is $\leq 200$ μs, and
the mean current flow density rise upon ignition of the plasma within a time interval that is $\leq 0.025$ ms is at least $106 \text{ A/(ms cm}^2)$,
and the indium tin oxide layer has a crystalline structure, in such a way that the (222)-reflection of an X-ray diffraction spectrum after the production of the indium tin oxide layer is shifted relative to the powder spectrum of indium tin oxide by a maximum of 1°, preferably by 0.3° to 0.5°, in the direction of compressive stress and is shifted after heat treatment by a maximum of 1°, preferably by 0.2° to 0.4°, in the direction of the powder spectrum. It becomes clear that the indium tin oxide layer of the glass product according to the invention has a strained layer construction before the heat treatment and is relaxed again after the heat treatment. In this case, it is particularly advantageous if the whole width at half maximum of the (222)-reflection of the X-ray diffraction spectrum is as wide as possible and, in particular, is substantially constant before and after heat treatment. The crystalline indium tin oxide layer of the glass product according to the invention is produced at a temperature $T \leq 100°$ C.—preferably at room temperature—on the surface of the glass substrate. Preferably, the indium tin oxide layer relaxes fully after the heat treatment. For some applications, however, it can also be advantageous if a small compressive stress is maintained in the indium tin oxide layer even after the heat treatment.

During high-power pulsed magnetron sputtering, the indium tin oxide layer is formed by physical vapor deposition (PVD). It has been shown that indium tin oxide layers having particularly advantageous mechanical, chemical and optical properties can be produced by high-power pulsed magnetron sputtering (HPPMS). This is a pulsed process in which the power density at the solid target can reach approximately 30 to 100 times the values customary in conventional DC magnetron sputtering. Furthermore, power densities far above 1 $\text{kW/cm}^2$ are possible. Under such process conditions, the magnetron discharge is operated in transition to the arc discharge. This results in increased ionization of the sputtered target material, which subsequently condenses on the glass substrate. The problem frequently encountered in the prior art of inadequate stability of a glass product which can be used, for example, for producing exterior glazings or exterior mirrors of a motor vehicle, comprising a transparent and conductive exterior coating of low emissivity, can be solved in a particularly advantageous manner by the use of the high-power magnetron sputtering method with the specified process parameters for producing the indium tin oxide layer, said method being distinguished by a high degree of ionization and by an increased kinetic energy of the layer-forming particle flow upon impingement on the substrate to be coated. As a result, firstly, the mobility of the adsorbed particles on the surface of the substrate is increased and, secondly, the energy inputs by virtue of the additional reflected neutral particles and by virtue of the negative oxygen ions formed at the target, which likewise impinge on the layer, are likewise greatly increased. Consequently, layer structures composed of indium tin oxide with small crystallinity can be formed on the glass substrate surface under specific pulse and power conditions even at room temperature. This requires a power density that is greater than that of a conventional DC discharge (3-10 $\text{W/cm}^2$) by a factor of 100-500 (preferably $1.5 \text{ kW/cm}^2$ or higher). Furthermore, the pulse durations have to be kept small (preferably <40 μs, in particular approximately 20 μs). Furthermore, the so-called duty cycle has to be kept small (preferably <5%) in order not to overload the target during sputtering. It has been shown that the pulse and power parameters are crucial here for producing mechanically and chemically stable layer structures composed of indium tin oxide on the glass substrate surface.

The heat treatment of the glass product can be effected, for example, by means of a single-pane safety glass or laminated safety glass heat treatment process (SPSG or LSG heat treatment process) at a temperature of approximately 650° C. to 750° C. Preferably, the indium tin oxide layer virtually maintains the crystallinity and also the crystallite size after the heat treatment process. One particularly advantageous embodiment provides for approximately 80% of the grain size of the indium oxide layer to be less than 30 nm, in particular less than 25 nm. In one preferred embodiment, the lateral grain size of the indium tin oxide layer is substantially constant before and after the heat treatment. One particularly advantageous embodiment proposes that the grain size distribution laterally/vertically is less than 40 nm (preferably less than 25 nm).

The glass product, after coating with the transparent and conductive indium tin oxide coating of low emissivity and the covering layer, has a thermal emissivity $\epsilon < 0.3$ (in particular 0.25 (0.12) given a sheet resistance of 20 (10) ohms). Consequently, ice formation on the surface of the glass product in typical misting and icing situations can be effectively prevented. Consequently, the glass product is suitable, in particular, for producing mechanically and chemically stable exterior glazings or exterior mirrors of motor vehicles.

One particular advantage of the glass product presented here is that the indium tin oxide layer, after the single-pane safety glass or laminated safety glass heat treatment process (SPSG or LSG heat treatment process) and/or bending process, has no cracks whatsoever and only very little haze and furthermore has a good conductivity in conjunction with high mechanical and chemical stability and likewise high optical transmission. The glass product comprising an indium tin oxide layer of this type thereby differs from the prior art to very considerable extent. The indium tin oxide layer has, after production at room temperature, a morphology/texture which leads to particularly advantageous layer properties after the SPSG or LSG heat treatment process. These advantageous properties are likewise reflected in a specific structure of the indium tin oxide layer. By virtue of the texture and morphology established with the aid of the high-power magnetron sputtering method, the indium tin oxide layer can attain the properties required in the subsequent heat treatment step carried out (SPSG/LSG process) and also withstand without damage a bending process that is carried out.

One preferred embodiment proposes that the indium tin oxide layer has a layer thickness that is ≤300 nm. One particularly preferred embodiment proposes that the indium tin oxide layer has a layer thickness of between 130 and 150 nm, in particular a layer thickness of approximately 140 nm. It has been shown that the indium tin oxide layer has a particularly high transparency in the case of a layer thickness of 140 nm.

One preferred embodiment proposes that the covering layer has a layer thickness of between 5 nm and 60 nm (preferably between 10 nm and 40 nm). In order to improve the optical properties of the glass product further, one advantageous embodiment proposes that the covering layer has a refractive index of between 1.50 and 1.95 at a wavelength of 550 nm. The covering layer is preferably produced by DC magnetron sputtering.

One preferred embodiment provides for the covering layer to be a silicon oxynitride layer. A silicon oxynitride layer is advantageously suitable for protecting the indium tin oxide layer against oxidation during a heat treatment step (for example during the single-pane safety glass or laminated safety glass heat treatment process, SPSG process/LSG heat treatment process), since it forms a redox barrier for the indium tin oxide layer.

One advantageous embodiment provides for the silicon oxynitride layer to have a percentage content of the elements:
Silicon: 25 to 50% Carbon: 0 to 15%
Oxygen: 10 to 30% Fluorine: 0 to 30%
Nitrogen: 0 to 50% Aluminum: 0 to 20%

In order to obtain particularly advantageous properties of the covering layer, one particularly preferred embodiment proposes that the silicon oxynitride layer has a percentage content of the elements:
Silicon: 35%±5% Carbon: <5%
Oxygen: 18%±5% Fluorine: <5%
Nitrogen: 35%±5% Aluminum: 4%±2%.

It has been shown, for example, that the surface energy can be advantageously altered in a targeted manner by the introduction of the fluorine and carbon fraction of the silicon oxynitride layer.

One particularly advantageous embodiment provides for the glass product to have a scattered-light component that is less than 2.5% after a wear test by means of an abrasion wheel method with scattered light measurement according to DIN 52 347 (1987). The scattered-light component is preferably less than 2.0%.

It has been shown, for example, that an indium tin oxide layer having a thickness of 140 nm, in the case of which it has a particularly high transparency, after an SPSG/LSG heat treatment process and/or bending process, has a good conductivity (<300 μΩcm) in conjunction with high transmission and likewise high mechanical and chemical stability. Therefore, a glass product comprising a glass substrate with an indium tin oxide layer of this type and also a covering layer composed of silicon oxynitride is particularly advantageously suitable for the production of an exterior glazing of low emissivity or an exterior mirror of a motor vehicle.

Further features and advantages of the present invention will become clear on the basis of the following description of preferred exemplary embodiments with reference to the accompanying figures, in which FIG. 1 shows the results of wear tests on a float glass sample and on float glass samples which were coated with a transparent and conductive indium tin oxide layer of low emissivity by means of high-power pulsed magnetron sputtering (HPPMS), FIG. 2 shows the results of X-ray diffractometry measurements on differently produced indium tin oxide layers on a float glass substrate;

The special properties of various glass products in accordance with preferred exemplary embodiments of the present invention comprising a transparent and conductive indium tin oxide layer of low emissivity and a covering layer, which forms a redox barrier for the indium tin oxide layer, will be explained in greater detail below.

Figure 1:
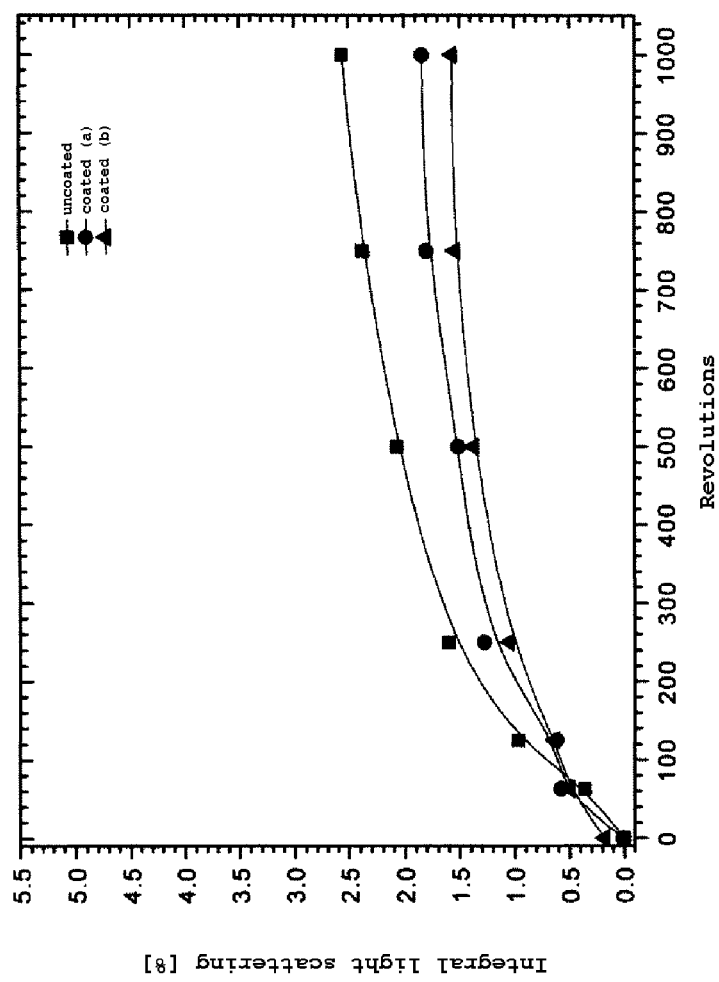

Firstly, FIG. 1 illustrates the results of wear tests on an uncoated float glass sample and also on two float glass samples which were coated with a transparent and conductive indium tin oxide layer of low emissivity by means of high-power pulsed magnetron sputtering (HPPMS). The measurement results give information about the wear of the samples after a specific mechanical loading. The highly ionizing high-power magnetron sputtering (HPPMS) used in this case for producing the indium tin oxide layers is distinguished, in particular, by the fact that the pulses of the magnetron have a peak power density that is greater than 1.5 $kW/cm^2$, the pulses of the magnetron have a time duration that is ≤200 μs, and the mean current flow density rise upon ignition of the plasma within a time interval that is ≤0.025 ms is at least 106 $A/(ms\ cm^2)$.

The wear tests were carried out by means of an abrasion wheel method with scattered light measurement according to DIN 52 347 (1987). This test method is often also referred to as "Taber Test". As explained in greater detail in DIN 52 347 (1987), the samples are subjected to sliding wear stress on a rotary table of the wear testing device by means of two abrasion wheels rotating in opposite directions. A measurement variable for the degree of wear of the samples is the scattered-light component of the transmitted light, which is brought about by surface changes and leads to haze of the samples. The integral light scattering which is a measure of the haze of the sample is plotted as a function of the number of revolutions of the rotary table of the standard-conforming wear testing device.

The wear measurements show that the integral light scattering is higher in the case of the coated samples before the beginning of the wear measurements than in the case of the uncoated float glass sample. In the case of all samples, the scattered-light component increases as the number of revolutions of the rotary table of the wear testing device increases. After 1000 revolutions, the scattered-light component of the uncoated float glass sample is >2.5%, whereas the scattered-light component of the coated float glass samples is in each case <2.5%. It is even possible to achieve scattered-light components that are <2.0%.

It thus becomes clear that a corresponding glass product whose indium tin oxide layer—as explained in the context of this application—was produced by high-power pulsed magnetron sputtering (HPPMS), on account of the comparatively low haze that is <2.5% even after a multiplicity of mechanical loading cycles, is suitable for use in vehicle construction, and in particular for producing exterior glazings or exterior mirrors.

Figure 2:
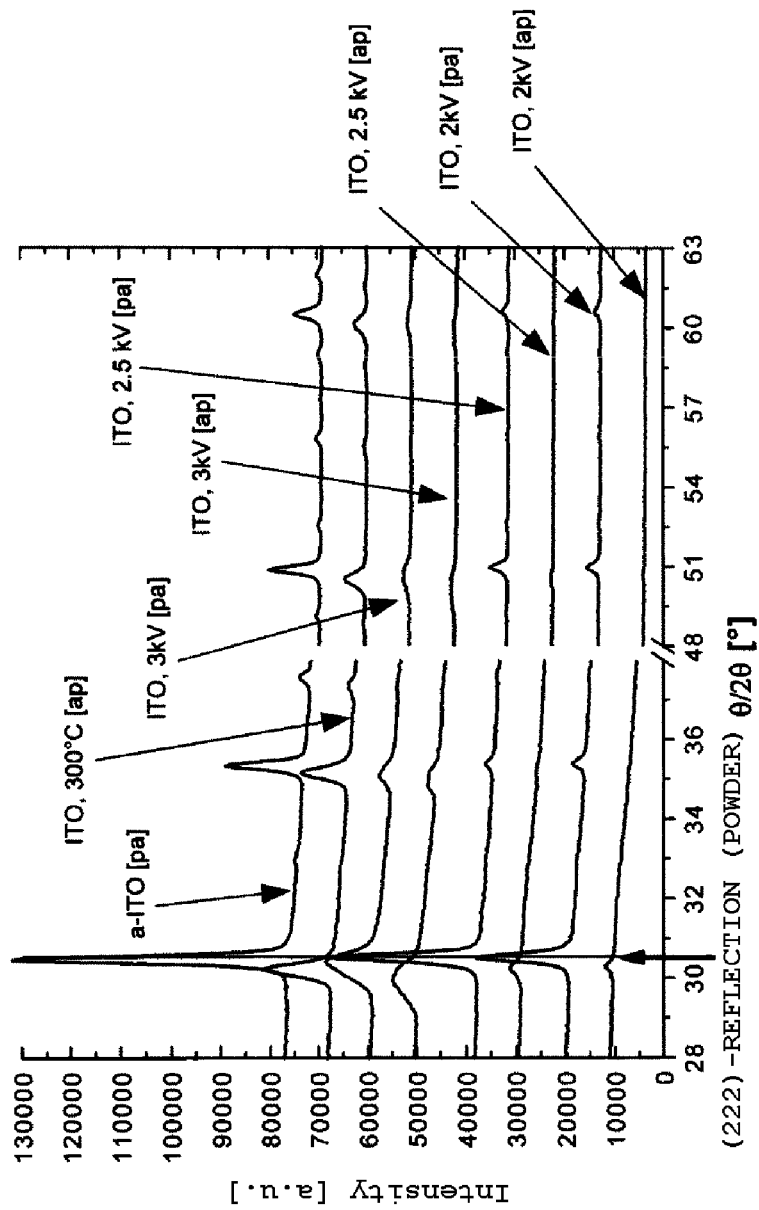

FIG. 2 shows a plurality of X-ray diffractometry diffractograms (XRD diffractograms with Bragg-Brentano geometry) of differently produced indium tin oxide layers that were in each case applied to a float glass substrate. Firstly, with the aid of a conventional DC magnetron sputtering method an amorphous ITO sample (a-ITO) was produced by the addition of hydrogen and in a subsequent heat treatment step—in a manner similar to that in the case of a single-pane safety glass heat treatment process—heated to a temperature of 650° C. and thereby crystallized. The results of the measurements on this sample exists with a-ITO [pa] in FIG. 2. In this case, the abbreviation "pa" stands for "post annealed". Furthermore, with the aid of a conventional DC magnetron sputtering method, an indium tin oxide layer was produced on the float glass substrate at substrate temperatures of 300° C. The results of the measurements on this sample exists with ITO 300° C. [ap] in FIG. 2. In this case, abbreviation "ap" stands for "as prepared".

Furthermore, a plurality of samples were produced by high-power pulsed magnetron sputtering at room temperature (ITO [ap]) and subsequently heat treated (ITO [pa]). In the case of the samples produced with the aid of the HPPMS method, the parameter of the charging voltage was changed in each case (2 kV, 2.5 kV, 3 kV). Here an increase in the charging voltage leads to an increase in the power density.

A comparison of the XRD measurements shows that the a-ITO [pa] sample has the greatest (222)-reflection. The HPPMS samples exhibit an increase in the intensity of the (222)-reflections after production ([ap]) in the case of an increase in the charging voltage. The samples exhibit an increase in the crystallinity and hence the (222)-reflection after heat treatment ([pa]) for the low charging voltage. At the highest charging voltage of 3 kV, apart from a shift in the (222)-reflection to higher angles, hardly any change in intensity can be ascertained. The shift in the reflection leads to an unstrained sample. This can be discerned on the basis of the position of the (222)-reflection of an ITO powder that is depicted as a vertical line in FIG. 2.

In contrast to the indium tin oxide coating produced at 300° C. by means of the conventional DC magnetron sputtering method, all the samples produced by the HPPMS method relax and have their (222)-reflection at a position such as also occurs in the ITO powder diffractogram. Preferably, the full width at half maximum (FWHM) of the (222)-peak in the case of a 140 nm thick indium tin oxide layer is as wide as possible and in particular constant before and after the heat treatment. The indium tin oxide layer has a strain after production on the substrate, such that the (222)-reflection after the production of the layer is shifted relative to the powder spectrum of indium tin oxide by a maximum of 1° (advantageously by 0.3° to 0.5°) in the direction of compressive stress. After the heat treatment, a shift in the (222)-reflection by a maximum of 1° (advantageously by 0.2° to 0.4°) in the direction of the powder spectrum can be observed. Preferably, the indium tin oxide layer relaxes completely after the heat treatment. For some applications, however, it can also be advantageous for a small compressive stress to be maintained in the indium tin oxide layer even after the heat treatment.

Figure 3:
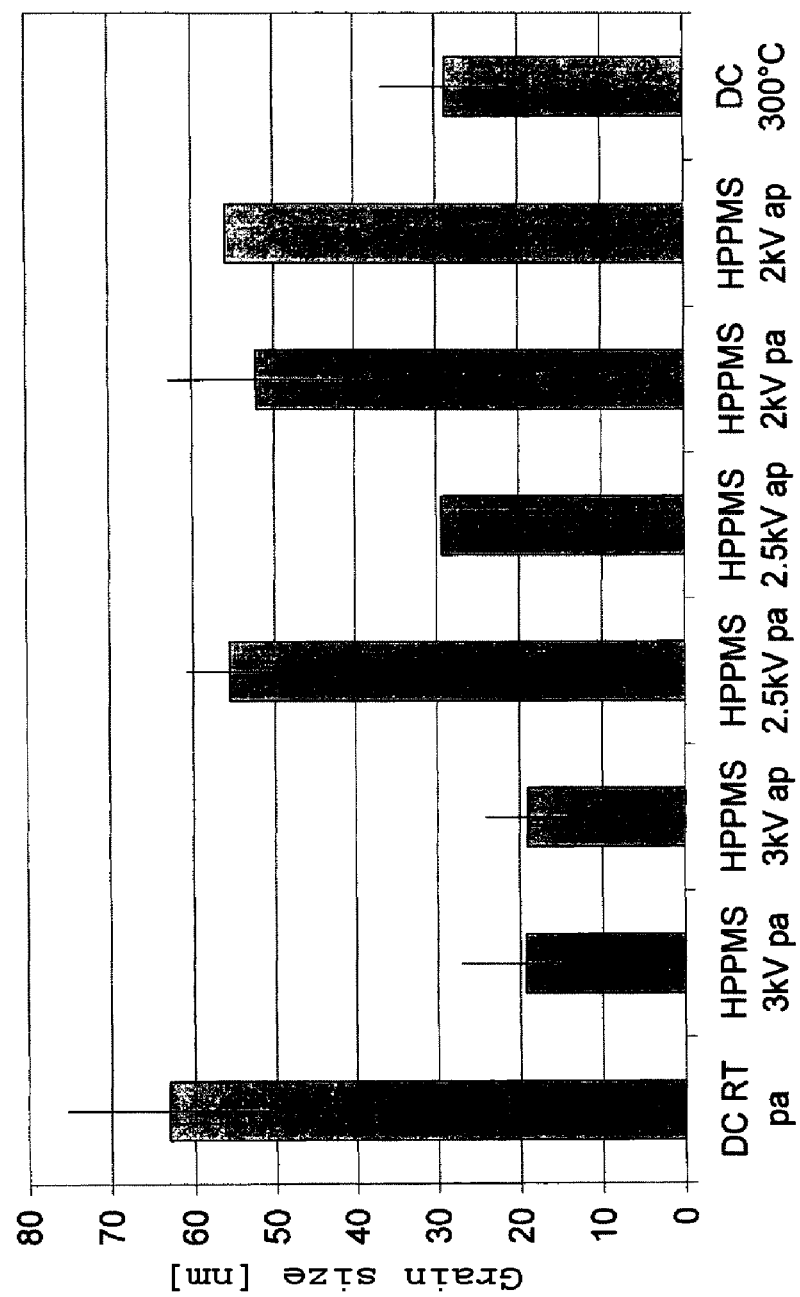
FIG. 3 shows the results of the determination of the grain sizes of the samples in accordance with FIG. 2.

The vertical grain size of the samples can be determined from the reflection shown in FIG. 2. The results of this grain size determination are summarized in FIG. 3. It becomes clear that the HPPMS samples that were produced with the highest charging voltage (3 kV) have the smallest crystallite size (<20 nm) of all the samples examined. The measurements furthermore show that the crystallite size is virtually unchanged before and after the heat treatment. If the layer morphology of the samples is examined by scanning electron microscopy (SEM), it is found that the HPPMS samples have a smaller lateral crystallite size in comparison with a sample produced at 300° C. by conventional DC magnetronسputtering.

The indium tin oxide layer of the glass product has a covering layer for protection against oxidation during a heat treatment step (for example during a single-pane safety glass or laminated safety glass process, SPSG process/LSG process). Said covering layer forms a redox barrier for the indium tin oxide layer and can be, in particular, a silicon oxynitride layer, which, if appropriate, can be doped with fluorine and/or aluminum. The covering layer is preferably produced by DC magnetron sputtering and has a layer thickness of between 5 nm and 60 nm. In comparison therewith, the indium tin oxide layer has a layer thickness that is ≤300 nm. Preferably, the indium tin oxide layer can have a layer thickness of between 130 and 150 nm, in particular a layer thickness of approximately 140 nm. It has been found that the indium tin oxide layer has a particularly high transparency in the case of a layer thickness of 140 nm.

In order to obtain particularly advantageous properties of the cover layer, it can be provided that the silicon oxynitride layer has a percentage content of the elements:
Silicon: 35%±5% Carbon: <5%
Oxygen: 18%±5% Fluorine: <5%
Nitrogen: 35%±5% Aluminum: 4%±2%

Figure 4:
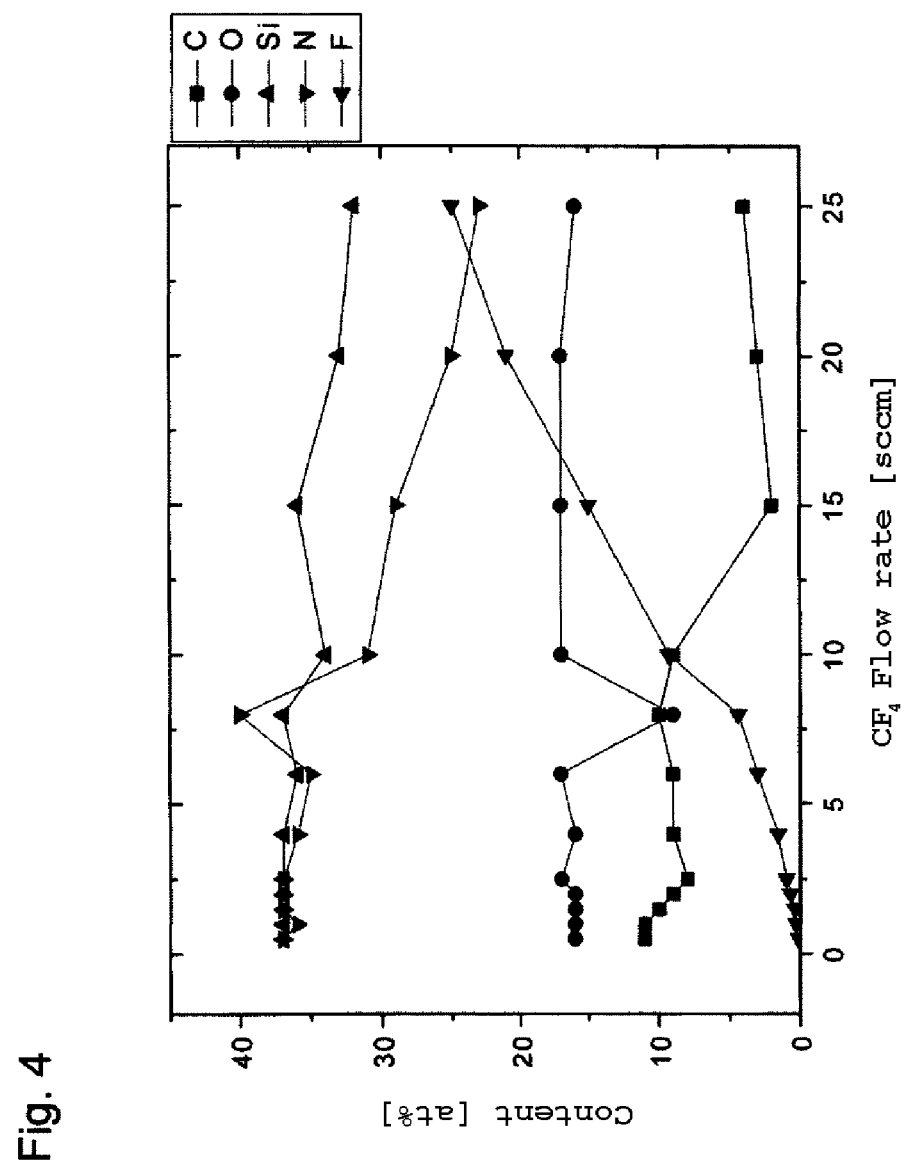
FIG. 4 shows the change in the layer composition of a silicon oxynitride covering layer of the glass product in the case of a change in the $CF_4$ flow rate.

FIG. 4 shows the change in the layer composition of the silicon oxynitride layer as a function of the change in the $CF_4$ flow rate (in standard cubic centimeters per minute, sccm) during the sputtering process. It becomes clear that the fluorine fraction in the layer composition can be changed continuously. By adapting the carbon fraction and the fluorine fraction of the silicon oxynitride layer, it is possible for the surface tension to be changed in a targeted manner and thus adapted to different conditions.

Figure 5:
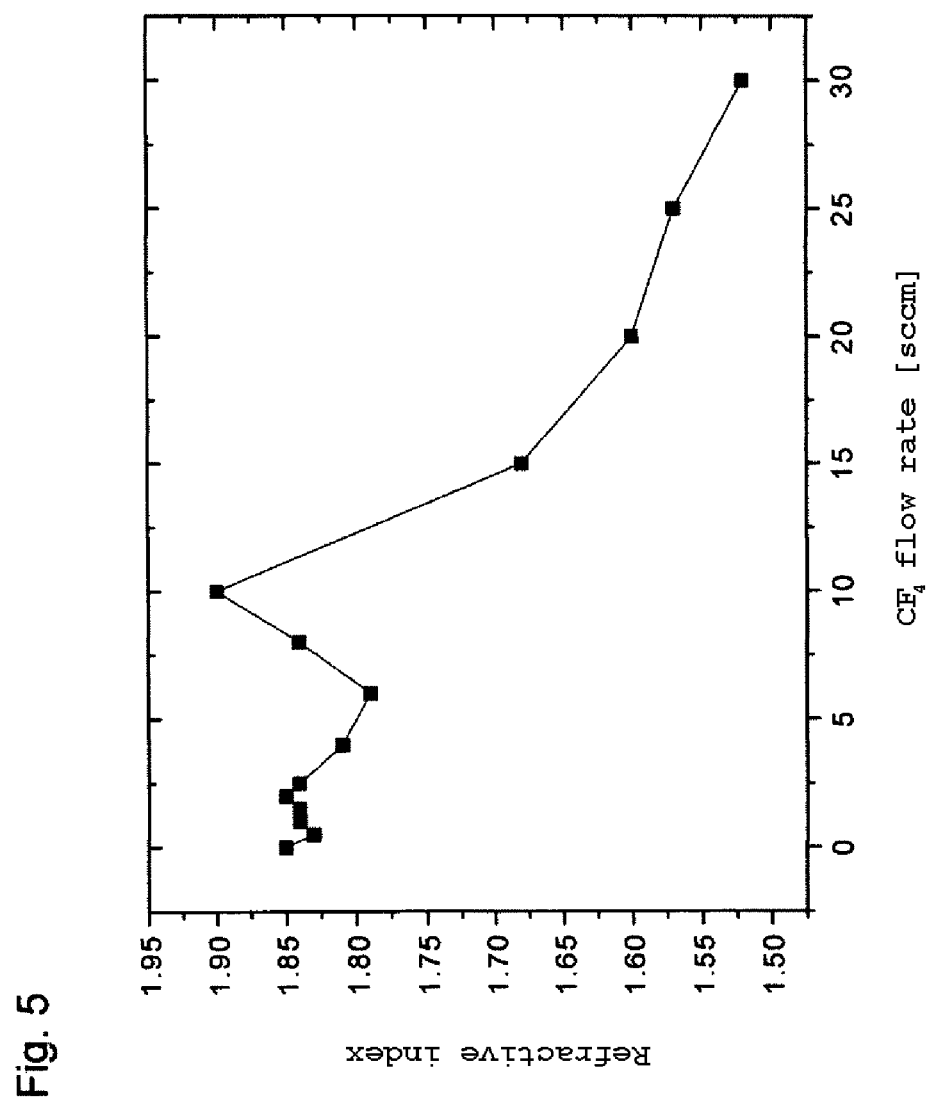
FIG. 5 shows the change in the refractive index of the covering layer of the glass product as a function of the $CF_4$ flow rate at a wavelength of 550 nm.

FIG. 5 illustrates the change in the refractive index of the silicon oxynitride layer at a wavelength of 550 nm as a function of the $CF_4$ flow rate (in standard cubic centimeters per minutes, sccm) in the silicon oxynitride layer during the sputtering process with nitrogen flow rate and oxygen flow rate kept constant. The measurement results make it clear that the refractive index can be changed in a targeted manner by changing the gas composition. The silicon oxynitride layer can have a refractive index of between 1.50 and 1.95 at a wavelength of 550 nm.

The glass product has, after coating with the transparent and conductive indium tin oxide layer of low emissivity and the covering layer, a thermal emissivity <0.3 (in particular 0.25 (0.12) given a sheet resistance of 20 (10) ohms). Consequently, ice formation on the surface of the glass product in typical misting and icing situations can be effectively prevented. The glass product is therefore suitable, in particular, for producing mechanically and chemically stable exterior glazings or exterior mirrors of motor vehicles.

The invention claimed is:

1. A glass product, comprising a glass substrate with a transparent and conductive indium tin oxide layer having a covering layer, which forms a redox barrier for the indium tin oxide layer, wherein the indium tin oxide layer is obtained by pulsed, highly ionizing high-power magnetron sputtering (HPPMS) in which the pulses of the magnetron have a peak power density that is greater than 1.5 kW/cm$^2$, the pulses of the magnetron have a time duration that is ≤200 µs, and the mean current flow density rise upon ignition of the plasma within a time interval that is ≤0.025 ms is at least 106 A/(ms cm$^2$), and wherein the indium tin oxide layer has a crystalline structure, such that the (222)-reflection of an X-ray diffraction spectrum after the production of the indium tin oxide layer is shifted relative to the powder spectrum of indium tin oxide by a maximum of 1° in the direction of compressive stress and is shifted after heat treatment by a maximum of 1° in the direction of the powder spectrum.

2. The glass product of claim 1, wherein approximately 80% of the grain size of the indium oxide layer is less than 30 nm.

3. The glass product of claim 1 or 2, wherein the lateral grain sizes of the indium tin oxide layer before and after the heat treatment are substantially constant.

4. The glass product of claim 1 or 2, wherein the indium tin oxide layer has a layer thickness that is ≤300 nm.

5. The glass product of claim 1 or 2, wherein the indium tin oxide layer has a layer thickness of between 130 and 150 nm.

6. The glass product of claim 1 or 2, wherein the covering layer has a layer thickness of between 5 nm and 60 nm.

7. The glass product of claim 1 or 2, wherein the covering layer has a refractive index of between 1.50 and 1.95 at a wavelength of 550 nm.

8. The glass product of claim 1 or 2, wherein the covering layer is obtained by DC magnetron sputtering.

9. The glass product of claim 1, wherein the covering layer is a silicon oxynitride layer.

10. The glass product of claim 9, wherein the silicon oxynitride layer is doped with fluorine and/or aluminum.

11. The glass product of claim 9 or 10, wherein the silicon oxynitride layer has a percentage content of the elements:
Silicon: 25 to 50% Carbon: 0 to 15%
Oxygen: 10 to 30% Fluorine: 0 to 30%
Nitrogen: 0 to 50% Aluminum: 0 to 20%.

12. The glass product of claim 9 or 10, wherein the silicon oxynitride layer has a percentage content of the elements:
Silicon: 35%±5% Carbon: <5%
Oxygen: 18%±5% Fluorine: <5%
Nitrogen: 35%±5% Aluminum: 4%±2%.

13. The glass product of claim 1, wherein the glass product has a scattered-light component that is less than 2.5% after a wear test by means of an abrasion wheel method with scattered light measurement according to DIN 52 347 (1987).

14. The glass product of claim 1 wherein the indium tin oxide layer has a crystalline structure such that the (222)-reflection of an X-ray diffraction spectrum after the production of the indium tin oxide layer is shifted relative to the powder spectrum of indium tin oxide by a maximum of 0.3° to 0.5° in the direction of compressive stress.

15. The glass product of claim 1, wherein the indium tin oxide layer has a crystalline structure such that the (222)-reflection of an X-ray diffraction spectrum is shifted after heat treatment by a maximum of 0.2° to 0.4° in the direction of the powder spectrum.

16. The glass product of claim 2, wherein approximately 80% of the grain size of the indium oxide layer is less than 25 nm.

17. The glass product of claim 1 or 2, wherein the indium tin oxide layer has a layer thickness of approximately 140 nm.

* * * * *